US012598923B2

(12) United States Patent
Gaudin et al.

(10) Patent No.: US 12,598,923 B2
(45) Date of Patent: Apr. 7, 2026

(54) METHOD FOR PRODUCING A SEMICONDUCTOR STRUCTURE COMPRISING AN INTERFACE REGION INCLUDING AGGLOMERATES

(71) Applicants: Commissariat À L'énergie Atomique Et Aux Énergies Alternatives, Paris (FR); Soitec, Bernin (FR)

(72) Inventors: Gweltaz Gaudin, Crolles (FR); Ionut Radu, Bernin (FR); Franck Fournel, Grenoble Cedex (FR); Julie Widiez, Grenoble Cedex (FR); Didier Landru, Le Champ-près-Froges (FR)

(73) Assignees: COMMISSARIAT A L'ENERGIE ATOMIQUE ET AUX ENERGIES ALTERNATIVES, Paris (FR); SOITEC, Bernin (FR)

( * ) Notice: Subject to any disclaimer, the term of this patent is extended or adjusted under 35 U.S.C. 154(b) by 327 days.

(21) Appl. No.: 18/257,217

(22) PCT Filed: Nov. 29, 2021

(86) PCT No.: PCT/FR2021/052124
§ 371 (c)(1),
(2) Date: Jun. 13, 2023

(87) PCT Pub. No.: WO2022/129726
PCT Pub. Date: Jun. 23, 2022

(65) Prior Publication Data
US 2024/0030033 A1     Jan. 25, 2024

(30) Foreign Application Priority Data
Dec. 15, 2020    (FR) ...................................... 2013294

(51) Int. Cl.
*H01L 21/18* (2006.01)
*H01L 21/02* (2006.01)
(Continued)

(52) U.S. Cl.
CPC ............ *H10P 10/128* (2026.01); *H10P 36/03* (2026.01); *H10P 90/00* (2026.01); *H10P 90/1916* (2026.01); *H10W 10/181* (2026.01)

(58) Field of Classification Search
CPC ............ H01L 21/187; H01L 21/02002; H01L 21/3221; H01L 21/76254
See application file for complete search history.

(56) References Cited

U.S. PATENT DOCUMENTS 7,208,392 B1 * 4/2007 Jaussaud ............. H01L 21/7602
438/455
2003/0094708 A1 * 5/2003 Itou .......................... H10D 1/66
257/E29.345
(Continued)

FOREIGN PATENT DOCUMENTS

EP      2490247 A1    8/2012
EP      3168862 A1    5/2017
FR      2798224 A1    3/2001
FR      3006236 A1    12/2014

OTHER PUBLICATIONS

International Search Report for International Application No. PCT/FR2021/052124 dated Mar. 18, 2022, 2 pages.
(Continued)

*Primary Examiner* — Christine S. Kim
*Assistant Examiner* — Sesha Sairaman Srinivasan
(74) *Attorney, Agent, or Firm* — TraskBritt

(57) ABSTRACT

A method for producing a semiconductor structure comprises: a) providing a working layer of a semiconductor material; b) providing a carrier substrate of a semiconductor material; c) depositing a thin film of a semiconductor
(Continued)

material different from that or those of the working layer and the carrier substrate on a free face to be joined of the working layer and/or the carrier substrate; d) directly joining the free faces of the working layer and the carrier substrate, e) annealing the joined structure at an elevated temperature to bring about segmentation of the encapsulated thin film and form a semiconductor structure comprising an interface region between the working layer and the carrier substrate, the interface region comprising: —regions of direct contact between the working layer and the carrier substrate; and —agglomerates comprising the semiconductor material of the thin film adjacent the regions of direct contact.

20 Claims, 5 Drawing Sheets

(51) Int. Cl.

| | | |
|---|---|---|
| *H01L 21/322* | (2006.01) | |
| *H01L 21/62* | (2006.01) | |
| *H10P 10/00* | (2026.01) | |
| *H10P 36/00* | (2026.01) | |
| *H10P 90/00* | (2026.01) | |
| *H10W 10/10* | (2026.01) | |

(56) References Cited

U.S. PATENT DOCUMENTS

| | | | | |
|---|---|---|---|---|
| 2011/0278597 | A1* | 11/2011 | Landru | H01L 21/76243 |
| | | | | 257/E21.24 |
| 2015/0014822 | A1* | 1/2015 | Reynaud | H01L 22/20 |
| | | | | 257/632 |
| 2015/0255354 | A1* | 9/2015 | Kitada | H10D 62/115 |
| | | | | 438/455 |
| 2015/0303316 | A1 | 10/2015 | Woo | |
| 2016/0014822 | A1* | 1/2016 | Yoshikawa | H04W 76/10 |
| | | | | 455/422.1 |
| 2016/0189995 | A1* | 6/2016 | Gondcharton | H01L 21/6835 |
| | | | | 438/107 |
| 2019/0165252 | A1* | 5/2019 | Broekaart | H03H 3/10 |
| 2019/0372552 | A1* | 12/2019 | Gaudin | H10N 30/072 |

OTHER PUBLICATIONS

International Written Opinion for International Application No. PCT/FR2021/052124 dated Mar. 18, 2022, 6 pages.
Mu et al., (Invited) Room Temperature Wafer Bonding of Wide Bandgap Semiconductors, ECS Transactions, (2018), vol. 86, No. 5.
European Extended Search Report for Application No. 24216751.8 dated May 2, 2025, 16 pages with machine translation.

* cited by examiner

METHOD FOR PRODUCING A SEMICONDUCTOR STRUCTURE COMPRISING AN INTERFACE REGION INCLUDING AGGLOMERATES

CROSS-REFERENCE TO RELATED APPLICATIONS

This application is a national phase entry under 35 U.S.C. § 371 of International Patent Application PCT/FR2021/052124, filed Nov. 29, 2021, designating the United States of America and published as International Patent Publication WO 2022/129726 A1 on Jun. 23, 2022, which claims the benefit under Article 8 of the Patent Cooperation Treaty to French Patent Application Serial No. FR2013294, filed Dec. 15, 2020.

TECHNICAL FIELD

The present disclosure relates to the field of semiconductor materials for microelectronic components. It relates to, in particular, a method for producing a structure comprising a working semiconductor layer and a semiconductor carrier substrate, joined at an interface region wherein regions of direct contact between the layer and the carrier substrate, and agglomerates comprising a semiconductor material other than the semiconductor material(s) of the layer and of the carrier substrate, co-exist side by side.

BACKGROUND

It is usual to form a semiconductor structure by transferring a working semiconductor layer, of low thickness and of high crystalline quality, onto a semiconductor carrier substrate of a lower crystalline quality. A well-known thin layer transfer solution is the Smart Cut™ method, based on implantation of light ions and on assembly, by direct bonding, at a bonding interface. In addition to economic advantages related to the streamlining of the high-quality material of the working layer, the semiconductor structure can also provide advantageous properties, for example, due to the thermal or electrical conductivity or mechanical compatibility of the carrier substrate.

In the field of power electronics, for example, it may also be advantageous to establish electrical conduction between the working layer and the carrier substrate, so as to form vertical components. For example, in the case of a structure comprising a working layer made of monocrystalline silicon carbide and a carrier substrate made of lower-quality silicon carbide (monocrystalline or polycrystalline), the bonding interface must have as low a resistivity as possible, preferentially less than 1 mohm·cm² or less than 0.1 mohm·cm².

In other fields, even if high vertical electrical conductivity is not required, direct contact between the working layer and the carrier substrate is necessary to guarantee electrical and/or thermal continuity, and/or very strong cohesion or mechanical strength.

Certain solutions of the prior art propose semiconductor-on-semiconductor bonding, by molecular adhesion, between the working layer and the carrier substrate. It is then required to manage the native oxide layers at the bonding interface, which prevent direct contact between the working layer and the carrier substrate. It is, in particular, possible to produce bonds of hydrophobic type, but from which it remains difficult to achieve a good interface quality.

F. Mu et al. (ECS Transactions, 86 (5) 3-21, 2018) implement direct bonding, after activation of the surfaces to be joined by argon bombardment (SAB for "surface activation bonding"): Such treatment prior to bonding generates a very high density of dangling bonds, which promote the formation of covalent bonds at the assembly interface, and therefore a high bonding energy. This method nevertheless has the drawback of generating an amorphous layer, at the joined surfaces, which particularly adversely affects the vertical electrical conduction between the thin layer and the carrier substrate. To overcome this problem, heavy doping of the surfaces is proposed, in particular, in document EP3168862.

BRIEF SUMMARY

The present disclosure relates to an alternative solution to those of the prior art, and aims to remedy all or some of the aforementioned drawbacks. It relates to, in particular, a method for producing a structure comprising a working semiconductor layer and a semiconductor carrier substrate, joined at an interface region comprising regions of direct contact between layer and carrier substrate, and agglomerates comprising a semiconductor material different from that (or those) of the layer and of the support substrate.

The present disclosure relates to a method for producing a semiconductor structure comprising the following steps:

a) providing a working layer made of a semiconductor material having a free face to be joined, b) providing a carrier substrate made of a semiconductor material having a free face to be joined, c) depositing a film composed of a semiconductor material different from that or those of the working layer and of the carrier substrate, having a thickness of less than 50 nm, on the free face to be joined of the working layer and/or on the free face to be joined of the carrier substrate, d) forming an intermediate structure, comprising directly joining, along a bonding interface extending along a main plane, the free faces to be joined of the working layer and of the carrier substrate, respectively, the intermediate structure comprising an encapsulated film originating from the one or more film(s) deposited during step c), e) annealing the intermediate structure at a temperature higher than or equal to a critical temperature, so as to bring about segmentation of the encapsulated film and form the semiconductor structure comprising an interface region between the working layer and the carrier substrate, the interface region comprising:

regions of direct contact between the working layer and the carrier substrate;

agglomerates comprising the semiconductor material of the film, and having a thickness, along an axis normal to the main plane, of less than or equal to 250 nm; the regions of direct contact and the agglomerates being adjacent in the main plane.

According to other advantageous non-limiting features of the present disclosure, taken alone or according to any technically feasible combination:

in step a), the free face to be joined of the working layer comprises a native oxide and/or, in step b), the free face to be joined of the carrier substrate comprises a native oxide;

in step e), the agglomerates of the interface region trap the oxygen originating from the native oxide(s), step a) comprises an implantation of light species in a donor substrate, to form a buried fragile plane that delimits, with a front face of the donor substrate, the working layer, step a) comprises the formation of the donor substrate by epitaxy of a donor layer on an initial substrate, the implantation being carried out subsequently, in the donor layer, step d) comprises, after the direct joining giving rise to a bonded assembly comprising the donor substrate and the carrier substrate, a separation at the buried fragile plane, in order to form, on the one hand, the intermediate structure comprising the working layer, the encapsulated film and the carrier substrate, and on the other hand, the remainder of the donor substrate, the thickness of the film deposited in step c) is less than or equal to 10 nm, or less than or equal to 5 nm, or less than or equal to 3 nm, or less than or equal to 2 nm, the thickness of the film deposited in step c) is less than 10 nm, and the agglomerates have a thickness, along an axis normal to the main plane, of less than or equal to 50 nm, the critical temperature is between 500° C. and 1800° C., depending on the nature of the semiconductor material of the film and of the semiconductor material(s) of the working layer and of the carrier substrate, the semiconductor material of the working layer is silicon carbide and has a monocrystalline, polycrystalline or amorphous structure, the semiconductor material of the carrier substrate is silicon carbide and has a monocrystalline, polycrystalline or amorphous structure, the semiconductor material of the film is selected from silicon or germanium, the agglomerates have a thickness of less than or equal to 40 nm, or even less than or equal to 30 nm, the agglomerates are in the form of first precipitates comprising the semiconductor material of the film, second precipitates comprising the semiconductor material of the film and oxygen, and/or cavities lined with a compound comprising the semiconductor material of the film and oxygen, the second precipitates have a substantially triangular shape in a transverse plane normal to the main plane, the agglomerates have lateral dimensions, in the main plane, between 5 nm and 500 nm.

The present disclosure also relates to an electronic component produced on and/or in the working layer of a semiconducting structure coming from the aforementioned production method. The semiconductor structure comprises:

the working layer made of a semi-conductor material, extending in a main plane, a carrier substrate made of a semiconductor material, and an interface region between the working layer and the carrier substrate, extending parallel to the main plane, the interface region comprising regions of direct contact between the working layer and the carrier substrate, and agglomerates comprising a semiconductor material different from that or those of the working layer and of the carrier substrate, and having a thickness, along an axis normal to the main plane, of less than or equal to 250 nm; the regions of direct contact and the agglomerates being adjacent in the main plane.

According to a particular variant, the component comprises at least one electrical contact on and/or in the carrier substrate, at a rear face of the semiconductor structure for a power application.

BRIEF DESCRIPTION OF THE DRAWINGS

Other features and advantages of the present disclosure will emerge from the following detailed description of example embodiments of the present disclosure with reference to the appended figures, wherein.

The same references in the figures may be used for elements of the same type. The figures are schematic depictions that, for the sake of readability, are not to scale. In particular, the thicknesses of the layers along the z-axis are not to scale relative to the lateral dimensions along the x-axis and the y-axis; and the relative thicknesses of the layers are not reflected in the figures.

DETAILED DESCRIPTION

Figures 1, 2A, 2B:
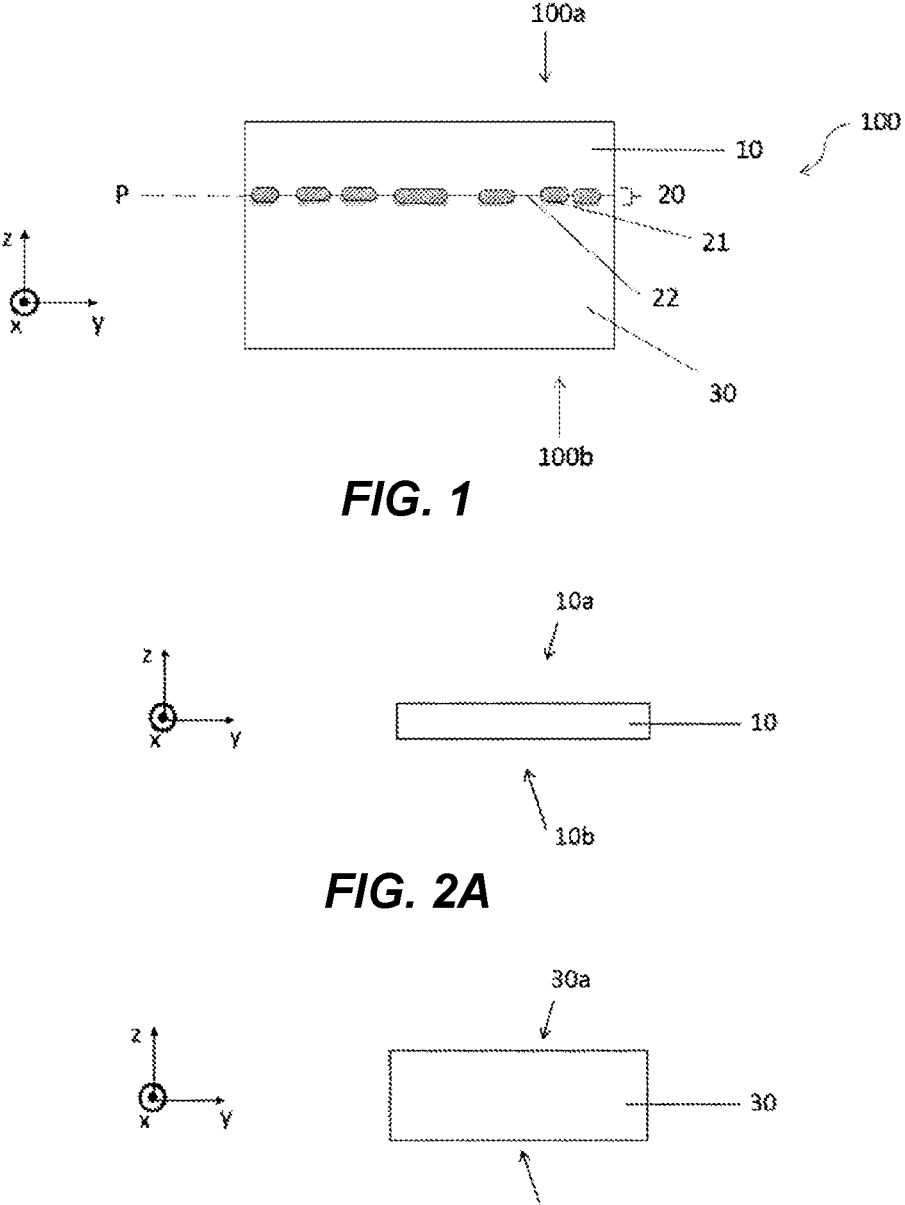
FIG. 1 shows a carrier substrate according to the present disclosure.
FIGS. 2A-2E show steps of a production method according to the present disclosure.

The present disclosure relates to a method for producing a semiconductor structure 100 comprising a working layer 10 made of monocrystalline semiconductor material, a carrier substrate 30 made of semiconductor material, and an interface region 20 between the working layer 10 and the carrier substrate 30 (FIG. 1). Like the working layer 10, the interface region 20 extends parallel to the main plane (x, y).

Advantageously, and as is usually the case in the field of microelectronics, the semiconductor structure 100 is in the form of a circular wafer with a diameter of between 100 mm and 450 mm, and of total thickness typically between 300 microns and 1000 microns. It is understood that, in this case, the carrier substrate 30 and the working layer 10 also have such a circular shape. The front 100a and rear 100b faces of the wafer extend parallel to the main plane (x, y).

Many types of semiconductor structure 100 allowing vertical electrical conduction or direct contact between the working layer 10 and the carrier substrate 30 may be of interest for microelectronic applications: the nature of the materials making up the working layer 10 and the carrier substrate 30 can therefore be quite varied.

By way of example, the semiconductor material of the working layer 10 may be chosen from silicon carbide, silicon, gallium nitride, gallium arsenide, indium phosphide and silicon-germanium alloys. In general, the production of components on the working layer 10 requires a high crystalline quality of the layer 10: it is therefore preferentially chosen to be monocrystalline, with a quality grade, type and doping level adapted to the targeted application. Alternatively, the working layer 10 may have, of course, a polycrystalline or amorphous structure.

Again, by way of example, the semiconductor material of the carrier substrate 30 may be chosen from silicon carbide, silicon, gallium nitride, gallium arsenide, indium phosphide and silicon-germanium alloys. It preferentially has a lower level of quality, essentially for economic reasons, and a monocrystalline, polycrystalline or amorphous structure. Its type and its doping level are chosen to respond to the targeted application.

The production method firstly comprises a step a) of providing the working layer 10 made of semiconductor material, preferentially monocrystalline (FIG. 2A). In this step a), the working layer 10 has a free face 10a intended to be joined, during a subsequent step of the method, also called front face 10a; it also has a rear face 10b opposite its front face 10a.

According to an advantageous embodiment, the working layer 10 is derived from the transfer of a surface layer of a donor substrate 1, in particular, a layer transfer based on the Smart Cut™ method.

Figure 3A:
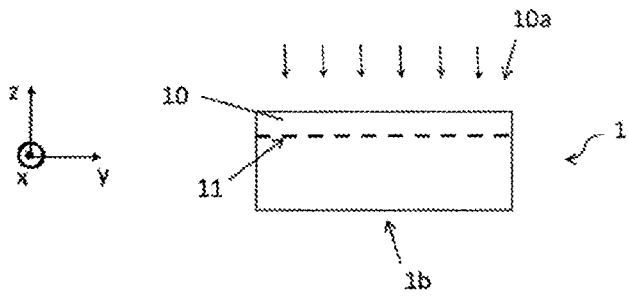
FIGS. 3A-3D show variants of steps of a production method according to the present disclosure.

Step a) can thus comprise an implantation of light species, for example, hydrogen, helium or a combination of these two species, into a donor substrate 1, to form a buried fragile plane 11 that delimits, with a front face 10a of the donor substrate 1, the working layer 10 (FIG. 3A).

Figure 3B:
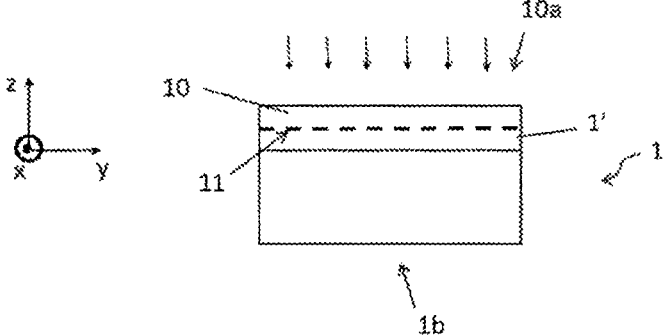

According to a variant of this embodiment, step a) comprises the formation of the donor substrate 1, by epitaxy of a donor layer on an initial substrate, prior to the implantation of the light species (FIG. 3B). This variant makes it possible to form a donor layer that has the structural and electrical characteristics required for the targeted application. In particular, excellent crystalline quality can be obtained by epitaxy, and in situ doping of the donor layer can be precisely controlled. The implantation of light species, to form the buried fragile plane 11, is then carried out in the donor substrate 1'.

Alternatively, the working layer 10, provided in step a), may be formed, of course, from other known thin-film transfer techniques.

The production method according to the present disclosure then comprises a step b) of providing a carrier substrate 30 made of semiconductor material (FIG. 2B). The carrier substrate 30 has a free face 30a intended to be joined during a subsequent step of the method, also called front face 30a; it also has a rear face 30b.

The working layer 10 and the carrier substrate 30 may be formed of one or more materials chosen from those mentioned above.

Figures 2C, 2D, 2E:
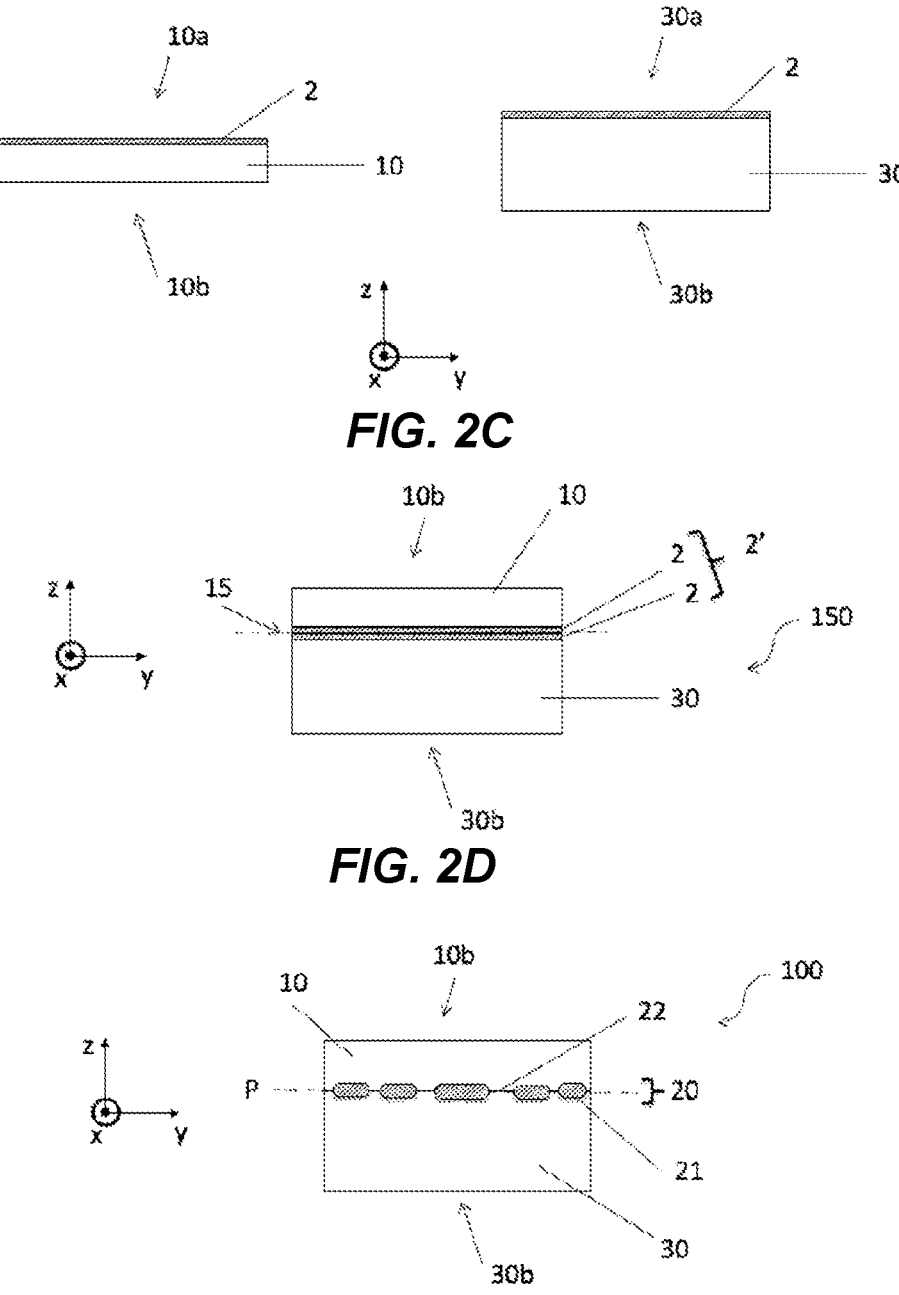

The production method then comprises a step c) of depositing a film 2 made of a semiconductor material (called the second material), on the free face 10a to be joined of the working layer 10 or on the free face 30a to be joined of the carrier substrate 30 or even, as is shown in FIG. 2C, on both of the free faces 10a, 30a to be joined. The second material is different from the semiconductor material(s) of the working layer 10 and of the carrier substrate 30.

Preferentially, the second material is chosen for its particular affinity with oxygen; furthermore, it is not a compound of several elements and, by reacting with oxygen, it must generate a solid and non-gaseous compound.

The second material must be able to be deposited in an extremely thin layer and be compatible with a microelectronic component manufacturing line ("front end of line"). It may be, in particular, chosen from silicon, germanium, etc., depending on the nature of the working layer 10 and of the carrier substrate 30.

The film 2 has a thickness of less than 50 nm, preferentially less than or equal to 10 nm, less than or equal to 8 nm, less than or equal to 5 nm, or even less than or equal to 3 nm, or even less than or equal to 2 nm. For example, the deposited film 2 may have a thickness on the order of 0.5 nm, 1 nm, 2 nm, 3 nm, 4 nm, 5 nm, 8 nm, 9 nm, 10 nm, 11 nm, 12 nm, 13 nm, 15 nm, 20 nm, 30 nm or 40 nm.

Note that when a film 2 is deposited on the two free faces 10a, 30a, the total deposited thickness, that is to say the sum of the thicknesses of the film 2 deposited on one and the other free faces 10a, 30a is preferentially less than 50 nm, preferentially less than or equal to 10 nm, less than or equal to 8 nm, or even less than or equal to 5 nm. The total thickness of deposited film 2 is always kept low, so as to allow a segmentation of the film in the form of agglomerates 21, in a subsequent step of the method.

The film 2 is deposited under a controlled atmosphere. Depending on the nature of the deposited film 2, step c) is carried out at low temperatures or even ambient temperature, advantageously by a known chemical vapor deposition technique (plasma-enhanced: PECVD, at subatmospheric pressure: LPCVD), or a spraying technique using, to bombard the target, a neutral element or whose residual presence in the deposited film is not troublesome (Ar, Si, N, etc.).

The production method then comprises a step d) of forming an intermediate structure 150, which step comprises a joining of the free faces 10a, 30a, respectively, of the working layer 10 and of the carrier substrate 30, at a bonding interface 15 extending along the main plane (x, y) (FIG. 2D).

This direct assembly is preferentially carried out by bonding by molecular adhesion, which involves contacting the faces 10a, 30a to be joined without adding intermediary adhesive material. It may be direct bonding between the working layer 10 and the film 2, when the latter has been deposited only on the carrier substrate 30, or direct bonding between the carrier substrate 30 and the film 2, when the latter has been deposited only on the working layer 10, or even direct bonding between two films 2, when they were deposited on the working layer 10 and on the carrier substrate 30. Direct assembly can be carried out in an ambient atmosphere, or under a controlled atmosphere and, in particular, under a high vacuum, on the order of $10^{-6}$ Pa or less.

Optionally, the deposition of step c) and the direct assembly of step d) are linked without breaking the vacuum, in-situ or in a multi-chamber equipment. By way of example, mention will be made of Atomic Diffusion Bonding BV7000 from the company Canon, wherein it is possible to successively carry out a direct deposition and bonding, by maintaining a controlled atmosphere.

Figure 3C:
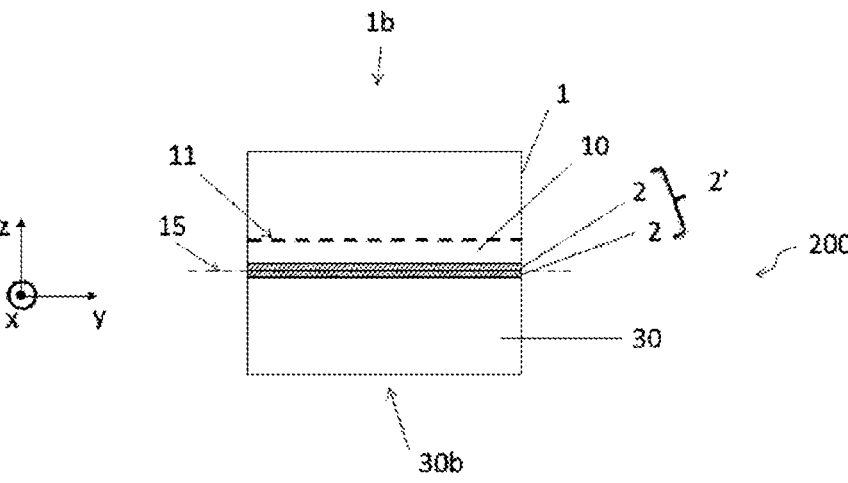
Figure 3D:
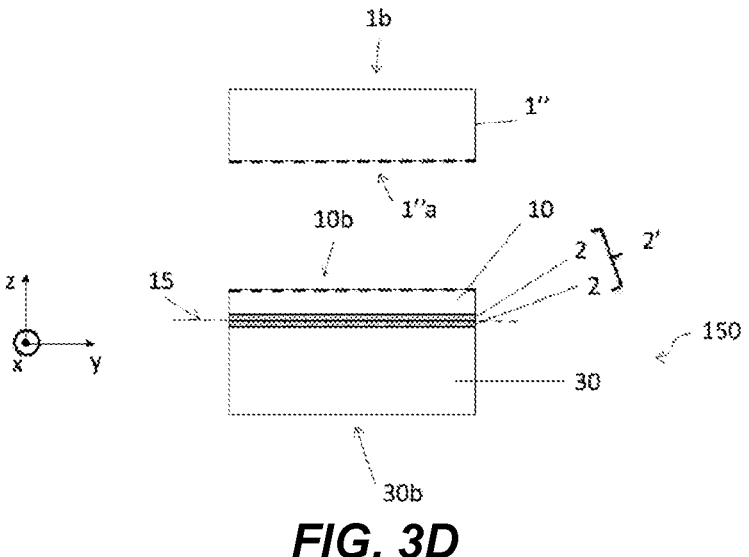

With reference to the advantageous embodiment shown in FIGS. 3A-3D, step d) comprising the direct joining of the free face 10a to be joined of the working layer 10 on the free face 30a to be joined of the carrier substrate 30, gives rise to a bonded assembly 200 that includes the donor substrate 1, the carrier substrate 30, and the bonding interface 15 (FIG. 3C). Step d) further comprises a separation at the buried fragile plane 11, in order to form, on the one hand, the intermediate structure 150 comprising the working layer 10, the film(s) 2 and the carrier substrate 30, and on the other hand, the rest of the donor substrate 1' (FIG. 3D). Such a separation can be carried out during a heat treatment capable of growing lenticular cavities ("platelets") and microcracks under pressure, induced by the implanted species, in the buried fragile plane 11. The separation can also be carried out by applying mechanical stress, or by the combination of thermal and mechanical stresses, as is well known in reference to the Smart Cut™ method.

Sequences for cleaning, smoothing, polishing or etching the separate face 10b of the working layer 10 and/or of the separate face 1"a of the rest of the donor substrate 1" will be able to be operated so as to restore a good surface quality, in particular, in terms of roughness, defectivity and other contaminations.

Regardless of the embodiment of the method, at the end of step d), the intermediate structure 150 has a front face 10*b* on the side of the working layer 10, a rear face 30*b* on the side of the carrier substrate 30, and an encapsulated film 2' between the working layer 10 and the carrier substrate 30. Note that the encapsulated film 2' Corresponds to the film 2 when the latter has been deposited only on one of the free faces 10*a*, 30*a*, or corresponds to the two films 2 deposited respectively on the working layer 10 and on the carrier substrate 30.

The production method according to the present disclosure then comprises a step e) of annealing the intermediate structure 150 at a temperature greater than or equal to a critical temperature, so as to bring about the segmentation of the encapsulated film 2' in the form of agglomerates 21 and to form an interface region 20 (FIG. 2E) comprising:

regions of direct contact 22 between the working layer 10 and the carrier substrate 30, in other words regions wherein there is a direct bond between the semiconductor materials of the working layer 10 and of the carrier substrate 30, and agglomerates 21 comprising the semi-conductor material of the film 2 (second material), and having a thickness, along an axis z normal to the main plane (x, y), low or very low, namely less than or equal to 250 nm, less than or equal to 50 nm, less than or equal to 40 nm, less than or equal to 30 nm, less than or equal to 20 nm, or even less than or equal to 10 nm.

The agglomerates 21, distributed in the interface region 20, are disjoint or joined, the disjoint agglomerates 21 are separated from one another by regions of direct contact 22. The regions of direct contact 22 and the agglomerates 21 are adjacent in the main plane (x, y).

Step e) results in the formation of the semiconductor structure 100.

The term "critical temperature" is used to mean the temperature from which it will be energetically more favorable for the second material to form agglomerates 21 rather than to remain in the form of a very fine encapsulated film 2'. The annealing temperature of step e) must, on the other hand, be sufficient to allow the bonding of the regions of direct contact 22, between the agglomerates 21. The critical temperature is typically between 500° C. and 1800° C., depending on the nature of the second material and the semiconductor material(s) of the working layer 10 and the carrier substrate 30.

The annealing step e) is therefore always carried out at a temperature greater than or equal to this critical temperature, and under neutral atmosphere, in particular, under argon, argon/hydrogen or nitrogen.

Beyond the critical temperature, the system including the encapsulated film 2' and the semi-conductor surfaces of the working layer 10 and of the carrier substrate 30 in contact with the film 2' will optimize its surface energy by segmenting the encapsulated film 2' in the form of agglomerates 21, and by creating regions of direct contact 22 between the semiconductor surfaces respectively of the working layer 10 and of the carrier substrate 30.

Furthermore, because the encapsulated film 2' is extremely thin, semiconductor materials known to be stable at low or medium temperature only, can be used as the second material in semiconductor structures 100 in accordance with the present disclosure capable of undergoing treatments at high (900° C.-1100° C.), or even very high (1200° C.-1900° C.) temperatures. Indeed, due to their precipitation in the form of agglomerates 21 of small dimensions and of very small thickness, they do not cause any deterioration of the structure 100 and, in particular, of the working layer 10. Mention will be made, for example, of agglomerates 21 comprising silicon in a structure 100 comprising a working layer 10 and a carrier substrate 30 made of Sic and intended to undergo epitaxy at a temperature of between 1600° C. and 1800° C. Note that in this example, a complete segmentation of the film 2' into agglomerates 21 is observed, at around 1700° C.

It is usual that, in step a), the free face 10*a* to be joined of the working layer 10 comprises a native oxide and/or, in step b), the free face 30*a* to be joined of the carrier substrate 30 comprises such an oxide. The fact of not having to manage this native oxide often simplifies the manufacturing steps.

Thus, in step e) of the process according to the present disclosure, the agglomerates 21 of the interface region 20 will be able to trap the oxygen obtained from the native oxide (s), and thus to eliminate any oxide of the interface between the working layer 10 and the carrier substrate 30, in the regions of direct contact 22.

Furthermore, it is possible that steps c) and/or d) of the method are carried out in an atmosphere comprising oxygen, which can release the manufacturing constraints: oxygen is then present at the bonding interface 15 in the intermediate structure 150.

In this case also, in step e), the agglomerates 21 of the interface region 20 will trap the oxygen of the bonding interface 15, thus avoiding the presence of oxygen in the regions of direct contact 22.

The production method as described therefore makes it possible to obtain a semiconductor structure 100 providing vertical electrical conduction and/or effective direct contact between the working layer 10 and the carrier substrate 30, via the interface region 20, thanks to the regions of direct contact 22 free of oxygen and/or native oxides. The very fine agglomerates 21 consist of the second material and optionally of oxygen, mainly trapped in the form of oxides.

In general, the agglomerates 21 are in the form of:

first precipitates comprising the semiconductor material of the film 2 (second material), and/or second precipitates comprising the second material and oxygen (mainly in the form of oxides of the second material), and/or cavities whose internal walls are lined with a compound comprising the second material and oxygen (mainly in the form of oxides of the second material).

The interface region 20 with the agglomerates 21, adjacent to the regions of direct contact 22, ensures the mechanical strength and more generally the reliability of the working layer 10 and/or the components that will be produced on or in the latter.

The semiconductor structure 100 according to the present disclosure guarantees good electrical conductivity and/or effective direct contact between the working layer 10 and the carrier substrate 30, via its interface region 20. In particular, the agglomerates 21, distributed in the interface region 20, in a median plane P substantially parallel to the main plane (x, y), are able to effectively trap the oxygen that may be present in the encapsulated film 2' or to the bonding interface 15; the regions of direct contact 22 between the working layer 10 and the carrier substrate 30, devoid of native oxide residues, in particular, allow electrical conduction and/or a vertical semi-conductor/semi-conductor contact that is effective and of good quality.

Furthermore, the agglomerates 21 and the regions of direct contact 22 ensure the mechanical continuity of the interface region 20 and provide excellent mechanical strength between the working layer 10 and the carrier substrate 30. The quality of the working layer 10 is therefore not affected by any holes or interface defects; note that the aforementioned cavities, when present, have dimensions and a density that do not negatively impact the quality and the resistance of the working layer 10.

On a median plane P of the interface region 20, the degree of coverage of the agglomerates 21 is typically between 1% and 50%, preferentially between 10% and 40%. The lateral dimensions (in the median plane P) of the agglomerates 21 are limited, typically on the order of 5 nm to 500 nm. In particular, when the thickness of the film 2 deposited in step c) is less than 10 nm, the lateral dimensions of the agglomerates 21 are about 5 nm to 150 nm and the thickness of the agglomerates 21 is less than or equal to 50 nm.

Among the agglomerates 21, the first precipitates and the cavities may have a lenticular or polygonal shape, and the second precipitates may have a substantially triangular shape, in a transverse plane normal to the main plane (x, y).

Example Embodiment

The donor substrate 1 is of high-quality monocrystalline 4H-SiC and has a diameter of 150 mm. The donor substrate 1 is n-doped, with a resistivity on the order of 20 mohm·cm. It is implanted through its front face, a type "C" face, with hydrogen ions at a dose of $5^E16/cm^2$ and an energy of 95 keV. Around the implantation depth, a buried fragile plane 11 is thus defined, delimiting, with the front face 10*a* of the donor substrate 1, the working layer 10.

The carrier substrate 30 is made of lower-quality monocrystalline 4H-SiC, of the same diameter as the donor substrate 1. It is n-doped with a resistivity on the order of 20 mohm·cm.

Both the substrates 1, 30 undergo cleaning sequences, in order to remove the particles and other surface contaminations. Both the substrates may comprise a native oxide on their surfaces.

The substrates 1, 30 are introduced into a first deposition chamber, integrated into direct bonding equipment. A silicon film 2 with a thickness of 1 nm is deposited on each of the front faces 10*a*, 30*a* (free faces to be joined) of the substrates 1, 30, under secondary vacuum, at $10^{-6}$ Pa and ambient temperature, by spraying.

The substrates 1, 30 are introduced into a second bonding chamber, to be joined at their front faces 10*a*, 30*a*, by directly contacting the films 2 deposited on the donor substrate 1 and on the carrier substrate 30, respectively. The atmosphere in the bonding chamber is the same as that in the deposition chamber, but could optionally be different: for example, the substrates may be removed from the first chamber, returned to the ambient atmosphere, then introduced into bonding equipment separate from the deposition chamber. Indeed, the method according to the present disclosure greatly relieves the constraints related to the presence of oxygen, for example, in the form of native oxides, in or on the films to be joined.

After assembly, the bonded assembly 200 comprises the donor substrate 1 bonded to the carrier substrate 30 via a bonding interface 15, and the encapsulated film 2' formed of the two films 2 deposited and buried between the two substrates 1, 30. The encapsulated film 2' has a thickness of about 2 nm.

The bonded assembly 200 is subjected to a heat treatment to cause separation at the buried fragile plane 11, at a temperature of about 900° C., for 30 minutes. The intermediate structure 150 including a working layer 10 having a thickness of 500 nm is then obtained, arranged on the encapsulated film 2', itself arranged on the carrier substrate 30. Cleaning and polishing sequences are applied so as to restore the right level of defectiveness and roughness to the rear face 10*b* of the working layer 10.

Finally, annealing at 1900° C. for 30 min is applied to the intermediate structure 150, previously provided with a protective layer on its front face 10*a* (also free face 10*b* of the working layer 10 in the intermediate structure 150). At the end of this annealing, the structure 100 according to the present disclosure is obtained: the interface region 20 is formed with agglomerates 21 comprising silicon and oxygen (mainly in SiOx form), separated by regions of direct contact 22 between working layer 10 and carrier substrate 30. Such an interface region 20 gives the structure 100 a good vertical electrical conductivity, close to that of a solid SiC substrate having a resistivity of 20 mohm·cm.

Figure 4A:
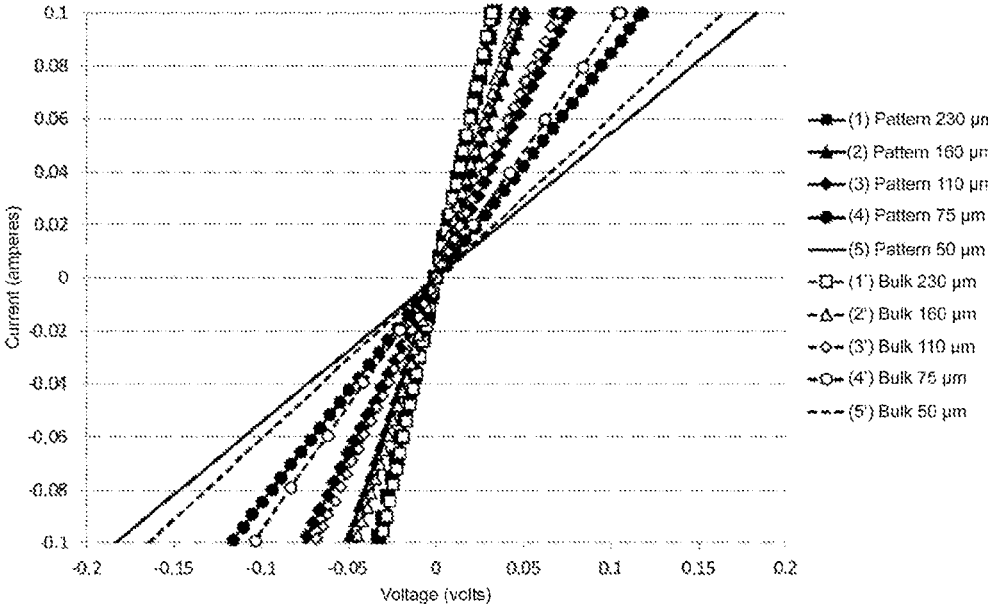
FIGS. 4A and 4B show, respectively, a graph I(V) (current as a function of voltage) comparing the electrical characteristics of an interface region of a semiconductor structure in accordance with the present disclosure and those of a solid substrate, for different sizes of electrode patterns, and the arrangement of the electrodes on the structure to carry out such a measurement.
Figure 4B:
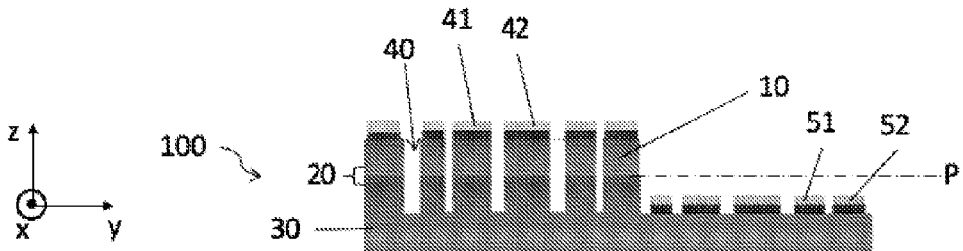

Interface region 20 has a resistivity of less than or equal to 0.1 mohm·cm². This is apparent in the graph of FIG. 4A that shows the current curves as a function of voltage I (V) for simple components comprising two metal contact electrodes 41, 42, of different sizes (between 50 microns and 230 microns in diameter); these electrode sizes (patterns) are plotted on the graph of FIG. 4A. In the case of the structure 100 according to the present disclosure, the measurement of I (V) is done at two electrodes 41, 42 between which the current path passes through the interface region 20, due to the presence of trenches 40, between the electrodes 41, 42, which pass through the interface region 20 (FIG. 4B). A resistivity of the interface region 20 of about 0.0076 mohm·cm² was extracted. For comparison and reference, electrodes 51, 52 are also deposited on the carrier substrate 30: The associated curves I (V) are marked "bulk" on the graph of FIG. 4A.

The agglomerates 21 in this structure 100 have a thickness of 5 nm to 15 nm and an average diameter on the same order of magnitude. The degree of coverage of the agglomerates 21, in a median plane P of the interface region 20 is about 20%.

It should be noted that annealing temperatures (step e), other than 1900° C., were also applied to the intermediate structure 150 described in the above example, for example, 1370° C. A resistivity of the interface region 20 of about 0.032 mohm·cm² was extracted, i.e., clearly less than 0.1 mohm·cm².

Of course, this example is not limiting and numerous other semiconductor structures 100 according to the present disclosure can be produced, based on different combinations of materials for the working layer 10, the film 2 and the carrier substrate 30, while adhering to the conditions set out above for the formation of the interface region 20.

Electronic components can be produced on and/or in the working layer 10 of a semiconductor structure 100 according to the present disclosure. These components may address, in particular, power applications, photovoltaic applications or light-emitting diodes.

The components may comprise at least one electrical contact on and/or in the carrier substrate 30, at a rear face 100*b* of the semiconductor structure 100, in particular, for power applications. By way of non-limiting examples, these power components may comprise transistors, diodes, thyristors or passive components (capacitors, inductors, etc.), etc.

Of course, the present disclosure is not limited to the described embodiments and examples, and variant embodiments can be provided thereto without departing from the scope of the invention as defined by the claims.

The invention claimed is:

1. A method for producing a semiconductor structure, the method comprising the following steps:
   a) providing a working layer made of a semiconductor material having a free face to be joined;
   b) providing a carrier substrate made of a semiconductor material having a free face to be joined;
   c) depositing a film composed of a semiconductor material different from that or those of the working layer and of the carrier substrate, having a thickness of less than 50 nm, on the free face to be joined of the working layer and/or on the free face to be joined of the carrier substrate;
   d) forming an intermediate structure, comprising directly joining, along a bonding interface extending along a main plane, the free faces to be joined of the working layer and of the carrier substrate, respectively, the intermediate structure comprising an encapsulated film originating from the one or more film(s) deposited during step c); and
   e) annealing the intermediate structure at a temperature higher than or equal to a critical temperature, so as to bring about segmentation of the encapsulated film and form the semiconductor structure comprising an interface region between the working layer and the carrier substrate, the interface region comprising:
   regions of direct contact between the working layer and the carrier substrate, and
   agglomerates comprising the semiconductor material of the film, and having a thickness, along an axis normal to the main plane, of less than or equal to 250 nm; the regions of direct contact and the agglomerates being adjacent in the main plane.

2. The method of claim 1, wherein:
   in step a), the free face to be joined of the working layer comprises a native oxide and/or, in step b), the free face to be joined of the carrier substrate comprises a native oxide; and
   in step e), the agglomerates of the interface region trap oxygen originating from the native oxide(s).

3. The method of claim 1, wherein step a) comprises an implantation of light species in a donor substrate to form a buried fragile plane delimiting, with a front face of the donor substrate, the working layer.

4. The method of claim 3, wherein step a) comprises forming the donor substrate by epitaxy of a donor layer on an initial substrate, the implantation being carried out subsequently, in the donor layer.

5. The method of claim 3, wherein step d) comprises, after the direct assembly giving rise to a bonded assembly comprising the donor substrate and the carrier substrate, a separation at the buried fragile plane to form, on the one hand, the intermediate structure comprising the working layer, the encapsulated film and the carrier substrate, and on the other hand, a remainder of the donor substrate.

6. The method of claim 1, wherein a thickness of the deposited film in step c) is less than or equal to 10 nm.

7. The method of claim 6, wherein the thickness of the deposited film in step c) is less than 10 nm, and the agglomerates have a thickness, along an axis normal to the main plane, of less than or equal to 50 nm.

8. The method of claim 6, wherein a thickness of the deposited film in step c) is less than or equal to 5 nm.

9. The method of claim 8, wherein a thickness of the deposited film in step c) is less than or equal to 3 nm.

10. The method of claim 9, wherein a thickness of the deposited film in step c) is less than or equal to 2 nm.

11. The method of claim 1, wherein the critical temperature is between 500° C. and 1,800° C.

12. The method of claim 1, wherein the semiconductor material of the working layer is silicon carbide and has a monocrystalline, polycrystalline or amorphous structure.

13. The method of claim 1, wherein the semiconductor material of the carrier substrate is silicon carbide and has a monocrystalline, polycrystalline or amorphous structure.

14. The method of claim 1, wherein the agglomerates have a thickness of less than or equal to 40 nm.

15. The method of claim 14, wherein the agglomerates have a thickness of less than or equal to 30nm.

16. The method of claim 1, wherein the agglomerates are in the form of:
   first precipitates comprising the semiconductor material of the film;
   second precipitates comprising the semiconductor material of the film and oxygen; and/or
   cavities lined with a compound comprising the semiconductor material of the film and oxygen.

17. The method of claim 16, wherein at least some of the agglomerates are in the form of the second precipitates and have a substantially triangular shape in a transverse plane normal to the main plane.

18. An electronic component produced on and/or in a working layer of a semiconductor structure, wherein the semiconductor structure is produced by a method comprising the following steps:
   a) providing a working layer made of a semiconductor material having a free face to be joined;
   b) providing a carrier substrate made of a semiconductor material having a free face to be joined;
   c) depositing a film composed of a semiconductor material different from that or those of the working layer and of the carrier substrate, having a thickness of less than 50 nm, on the free face to be joined of the working layer and/or on the free face to be joined of the carrier substrate;
   d) forming an intermediate structure, comprising directly joining, along a bonding interface extending along a main plane, the free faces to be joined of the working layer and of the carrier substrate, respectively, the intermediate structure comprising an encapsulated film originating from the one or more film(s) deposited during step c); and
   e) annealing the intermediate structure at a temperature higher than or equal to a critical temperature, so as to bring about segmentation of the encapsulated film and form the semiconductor structure comprising an interface region between the working layer and the carrier substrate, the interface region comprising:
   regions of direct contact between the working layer and the carrier substrate, and
   agglomerates comprising the semiconductor material of the film, and having a thickness, along an axis normal to the main plane, of less than or equal to 250 nm; the regions of direct contact and the agglomerates being adjacent in the main plan; and
   wherein the semiconductor structure comprises:
   the working layer made of a semiconductor material, extending in a main plane; and
   the carrier substrate made of a semiconductor material;
   and an interface region between the working layer and the carrier substrate, extending parallel to the main plane, the interface region comprising regions of direct contact between the working layer and the carrier substrate, and agglomerates, comprising a semiconductor material different from that or those of the working layer and of the carrier substrate, and having a thickness, along an axis normal to the main plane, of less than or equal to 250 nm, the regions of direct contact and the agglomerates being adjacent in the main plane.

19. The electronic component of claim 18, further comprising at least one electrical contact on and/or in the carrier substrate, at a rear face of the semiconductor structure.

20. An electronic component produced on and/or in a working layer of a semiconductor structure, the semiconductor structure comprising:

a working layer made of a semiconductor material, the working layer extending in a main plane;

a carrier substrate made of a semiconductor material; and an interface region between the working layer and the carrier substrate, extending parallel to the main plane, the interface region comprising regions of direct contact between the working layer and the carrier substrate, and agglomerates, comprising a semiconductor material different from that or those of the working layer and of the carrier substrate, and having a thickness, along an axis normal to the main plane, of less than or equal to 250 nm, the regions of direct contact and the agglomerates being adjacent in the main plane.

* * * * *